US006995082B2

(12) United States Patent
Lee

(10) Patent No.: US 6,995,082 B2
(45) Date of Patent: Feb. 7, 2006

(54) BONDING PAD OF A SEMICONDUCTOR DEVICE AND FORMATION METHOD THEREOF

(75) Inventor: Date-Gun Lee, Bucheon (KR)

(73) Assignee: DongbuAnam Semiconductor, Inc., Seoul (KR)

( * ) Notice: Subject to any disclaimer, the term of this patent is extended or adjusted under 35 U.S.C. 154(b) by 0 days.

(21) Appl. No.: 10/722,299

(22) Filed: Nov. 25, 2003

(65) Prior Publication Data

US 2004/0115942 A1 Jun. 17, 2004

(30) Foreign Application Priority Data

Dec. 17, 2002 (KR) ...................... 10-2002-0080763

(51) Int. Cl.
*H01L 21/302* (2006.01)

(52) U.S. Cl. ...................... 438/612; 438/613; 438/614; 438/700; 438/720; 257/459

(58) Field of Classification Search ................ 438/612, 438/613, 614, 700, 720; 257/459
See application file for complete search history.

(56) References Cited

U.S. PATENT DOCUMENTS

| | | | |
|---|---|---|---|
| 5,430,329 A | 7/1995 | Harada et al. | |
| 5,923,072 A | 7/1999 | Wada et al. | |
| 6,162,652 A * | 12/2000 | Dass et al. | 438/18 |
| 6,191,023 B1 | 2/2001 | Chen | |
| 6,376,353 B1 | 4/2002 | Zhou et al. | |
| 6,426,556 B1 * | 7/2002 | Lin | 257/738 |
| 6,471,115 B1 | 10/2002 | Ijuin et al. | |
| 6,583,039 B2 * | 6/2003 | Chen et al. | 438/612 |

FOREIGN PATENT DOCUMENTS

JP 6-244237 9/1994

OTHER PUBLICATIONS

Yokoyama Akihiro: Semiconductor Device and Manufacturing Method Thereof, Patent Abstracts of Japan: Filed Feb. 19, 2003; 1 Page: Publication No. 06-244237, Publication Date Feb. 9, 1994.

* cited by examiner

*Primary Examiner*—George A. Goudreau
(74) *Attorney, Agent, or Firm*—Andrew D. Fortney

(57) ABSTRACT

The present invention relates to a bonding pad of a semiconductor device and a formation method thereof, and the object of the present invention is to prevent bonding defects by enlarging contact area between a bonding pad and a soldering material and to prevent moisture from penetrating into an oxide layer. The present invention provides a bonding pad of a semiconductor device comprising: a barrier metal layer formed on a structure of a semiconductor substrate; a metal wire layer formed on the barrier metal layer; a passivation metal layer formed on the metal wire layer and removed partly to expose a portion of the upper surface of the metal wire layer; an insulating layer which is formed on the passivation metal layer and has a contact hole exposing the metal wire layer via the portion that the passivation metal layer is removed; and an adhesive metal layer formed on the inner surface of the contact hole.

19 Claims, 5 Drawing Sheets

BONDING PAD OF A SEMICONDUCTOR DEVICE AND FORMATION METHOD THEREOF

BACKGROUND OF THE INVENTION (a) Field of the Invention

The present invention relates to a semiconductor device, and particularly to a bonding pad included in a semiconductor device and a formation method of the bonding pad.

(b) Description of Related Art

In general, a bonding pad is formed as an exposed part of the uppermost metal wire of a semiconductor device and serves as a terminal to connect the semiconductor device to a package. That is, wiring of the semiconductor device is electrically connected to an external device such as power supply via the bonding pad connected to a metal wire by bonding process.

FIG. 1*a* is a sectional view of a conventional bonding pad, and FIGS. 1*b* and 1*c* are sectional views of the boding pad to explain bonding process and molding process, respectively.

For every semiconductor device, the last process of fabrication is the process of a forming bonding pad 3 by exposing a portion of a metal wire layer 1. Then, back grinding process and package assembly process are continued. Through the assembly process, the metal wire layer 1 and a metal wire 7 are bonded to each other by soldering 5, and the connection point of the bonding pad 3 and the metal wire 7 are molded using a molding material 9 such as epoxy.

However, for the conventional bonding pad 3, contact area between the exposed metal wire layer 1 and the soldering 5 is narrow. Therefore, bonding defects easily occur due to imperfect bonding. Also, moisture might penetrate into the insulating layer 11, which is an oxide layer, when molding using a molding material such as epoxy.

Prior arts disclosing subject matters related to bonding pad, adhesiveness, and moisture include the following U.S. patents.

U.S. Pat. No. 6,471,115 discloses a formation method of an electronic circuit device using solder material as an electrode or an electrical part on a printed circuit board, U.S. Pat. No. 6,376,353 discloses a process for placing a specific Al—Cu bond layer or area on a copper pad, U.S. Pat. No. 6,191,023 discloses an aluminum bond pad structure for improving adhesiveness between a copper pad and a tantalum nitride pad barrier layer using a special interlocking bond pad structure, U.S. Pat. No. 5,923,072 discloses a semiconductor device including a metal passivation film formed between a portion of surface of a metal pattern and moisture penetration path, U.S. Pat. No. 5,430,329 discloses a semiconductor device having an elastic insulating film covering inner surface of a pad electrode opening, and so forth.

SUMMARY OF THE INVENTION

Therefore, the present invention is to resolve the above problems, and an object of the present invention is to provide a bonding pad of a semiconductor device and a formation method thereof, which is able to prevent bonding defects by enlarging contact area between a bonding pad and a soldering material and to prevent moisture from penetrating into an insulating layer, which is an oxide layer.

To achieve the above object, the present invention provides a bonding pad of a semiconductor device comprising: a barrier metal layer formed on a structure of a semiconductor substrate; a metal wire layer formed on the barrier metal layer; a passivation metal layer formed on the metal wire layer and removed partly to expose a portion of the upper surface of the metal wire layer; an insulating layer which is formed on the passivation metal layer and has a contact hole exposing the metal wire layer via the portion that the passivation metal layer is removed; and an adhesive metal layer formed on the inner surface of the contact hole.

The adhesive metal layer is made of any one of metallic material selected from a group of Al, Ti, and TiN, and thickness thereof is 1000–3000 Å.

The present invention also provides a formation method of a bonding pad of a semiconductor device comprising: forming a barrier metal layer on a structure of a semiconductor substrate and depositing a metal wire layer and a passivation metal layer on the barrier metal layer; forming an insulating layer and a passivation layer covering the barrier metal layer, the metal wire layer, and the passivation metal layer; forming a contact hole by coating a photoresist layer on the passivation layer, exposing and developing the photoresist layer to remove a portion of the photoresist layer selectively on an area where a contact hole will be formed, and etching the passivation layer exposed by the removed portion of the photoresist layer and the insulating layer and passivation metal layer under the passivation layer; removing the photoresist layer and forming a metal layer on entire surfaces of the passivation layer and the contact hole; and forming an adhesive metal layer by dry-etching the metal layer to remove portions of the metal layer placed on the surfaces of the passivation layer and metal wire layer and thus remaining only the portion of the metal layer inside the contact hole.

It is preferable that the metal wire layer is formed by depositing aluminum alloy at a temperature of equal to or higher than 100° C. The adhesive metal layer is made of any one of metallic material selected from a group of Al, Ti, and TiN, and thickness thereof is 1000–3000 Å.

DETAILED DESCRIPTION OF THE PREFERRED EMBODIMENTS

Figure 1A:
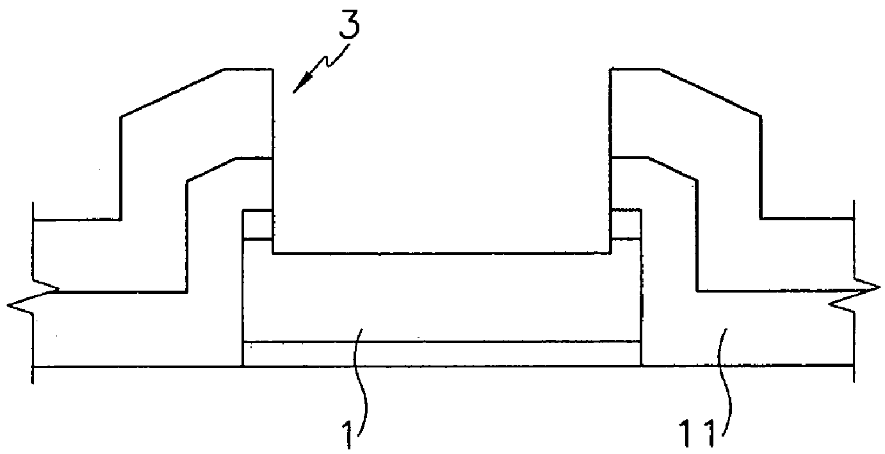
FIG. 1*a* is a sectional view of a conventional bonding pad.
Figure 1B:
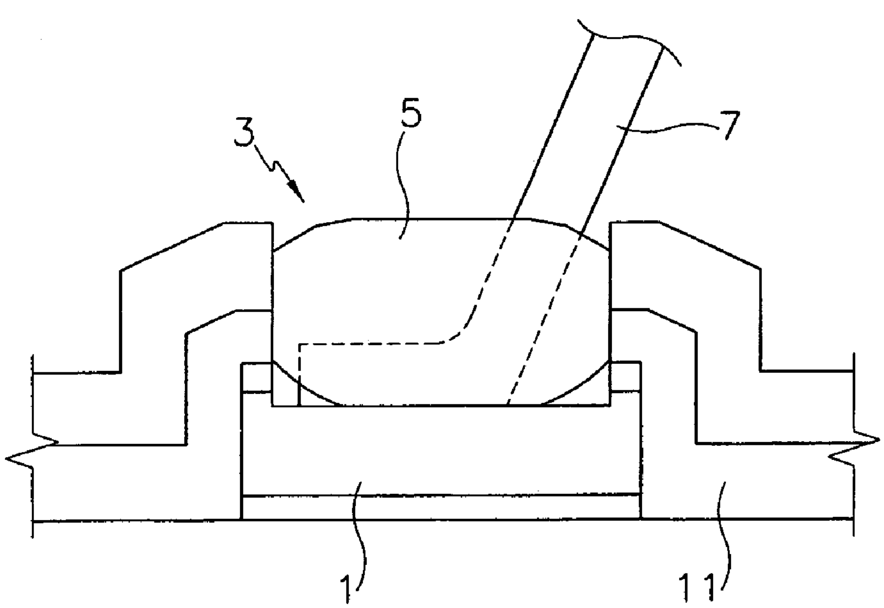
FIGS. 1*b* and 1*c* are sectional views of a conventional boding pad to explain bonding process and molding process, respectively.
Figure 1C:
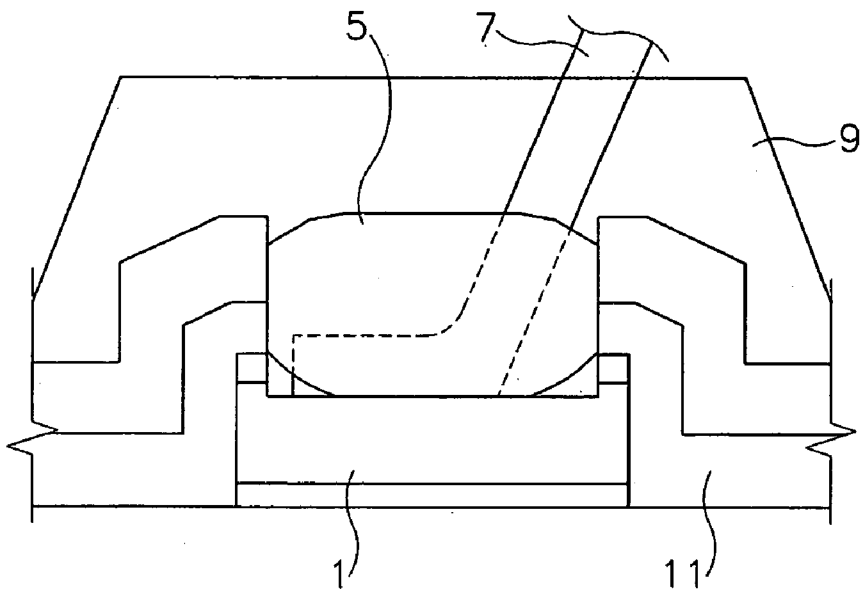

The present invention now will be described more fully hereinafter with reference to the accompanying drawings, in which preferred embodiments of the inventions invention are shown. The present invention may, however, be embodied in many different forms and should not be construed as limited to the embodiments set forth herein. In the drawings, the thickness of layers and regions are exaggerated for clarity.

Figure 2A:
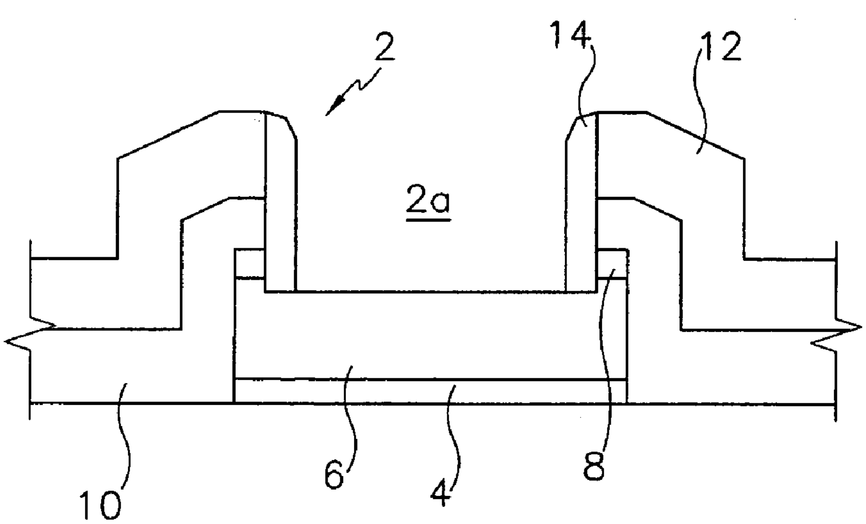
FIG. 2*a* is a sectional view of a bonding pad of a semiconductor device according to the present invention.
Figure 2B:
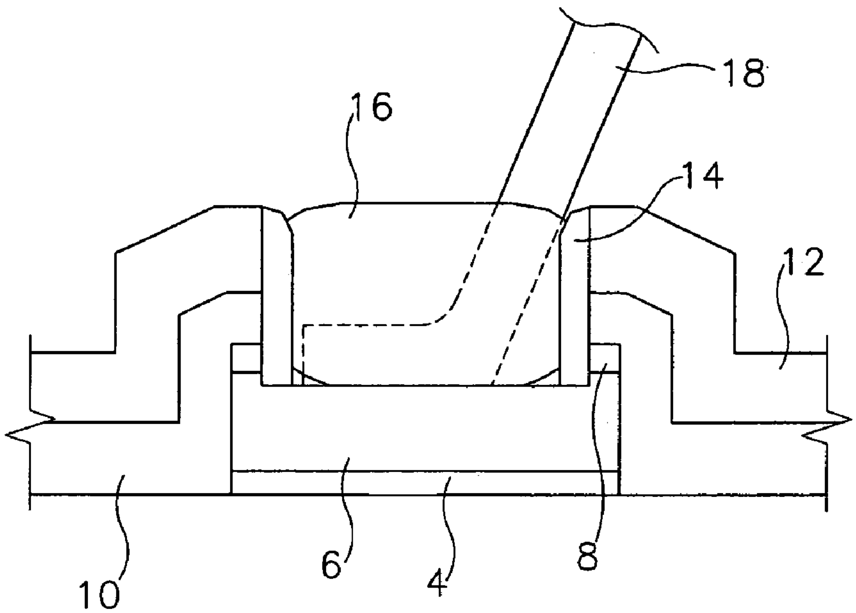
FIG. 2*b* is a sectional view of a bonding pad to which a metal wire is attached according to the present invention.

FIG. 2*a* is a sectional view of a bonding pad of a semiconductor device according to the present invention, and FIG. 2*b* is a sectional view of a bonding pad to which a metal wire is attached, in which the bonding pad 2 is formed on the uppermost part of a semiconductor substrate on which a structure of the semiconductor substrate, i.e. an individual device is formed.

The bonding pad 2 according to the present invention includes a barrier metal layer 4 formed on a structure of a semiconductor substrate, a metal wire layer 6 formed on a barrier metal layer 4, a passivation metal layer 8 which is formed on the metal wire layer 6 and partly removed in a portion of the bonding pad 2 to expose the center portion of upper surface of the metal wire layer 6 thereunder, an insulating layer 10 covering lateral surfaces of the passivation metal layer 8 and the metal wire layer 6, a passivation layer 12 formed on the insulating layer, and an adhesive metal layer 14 formed on inner surface of a contact hole 2a exposing the metal wire layer 6 by passing through the passivation layer 12 and the insulating layer 10. The adhesive metal layer 14 extends to upper surface of the metal wire layer 6.

The barrier metal layer 4 electrically connects a metal wire (not shown) of the semiconductor substrate to the metal wire layer 6 and improves adhesiveness of the metal wire layer 6 to the semiconductor substrate. It is preferable that the barrier metal layer 4 is made of a metal including Ti, Ta, TiN, or TaN and thickness thereof is 200–1000 Å.

The metal wire layer 6 is made of aluminum alloy. The passivation metal layer 8 is made of a metallic material including Ti, TiN, Ta, TaN, WN, or Si and having higher melting point than that of aluminum alloy. The passivation metal layer 8 may be formed as a single layer of a single high melting point metal. Alternatively, the passivation metal layer 8 may be formed as a multiple-layer structure of two or more high melting point metals. The insulating layer 10 and the passivation layer 12 are made of an oxide layer and a nitride layer, respectively.

A portion of upper surface of the metal wire layer 6 is exposed via the contact hole 2a passing through the insulating layer 10 and the passivation layer 12 and adhered to the metal wire 18 by soldering during bonding process. Since the adhesive metal layer 14 is formed on the inner surface of the contact hole 2a, the area that the soldering material contacts inside the contact hole 2a during the soldering process for connecting the metal wire 18 increases. Therefore, the metal wire 18 is fixed inside the contact hole 2a more firmly.

It is preferable that the adhesive metal layer 14 is made of a metallic material such as Al, Ti, or TiN and thickness thereof is about 1000–3000 Å. Since the adhesive metal layer 14 is formed to cover the lateral surface of the contact hole 2a, the adhesive metal layer 14 also prevents moisture from penetrating into the insulating layer during molding process using epoxy, which follows the bonding process.

Next, a formation method of a bonding pad of a semiconductor device according to the present invention will be described with reference to FIGS. 3a–3e.

Figure 3A:
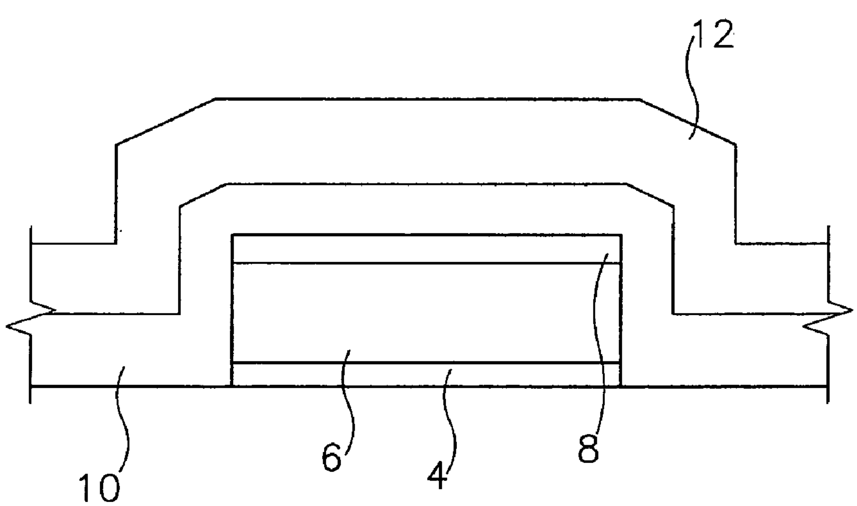
FIGS. 3*a*–3*e* are sectional views of a bonding pad for describing a formation method of the bonding pad according to the present invention.

First, as shown in FIG. 3a, a barrier metal layer 4, a metal wire layer 6, and a passivation metal layer 8 are formed by depositing three metal layers sequentially on a semiconductor substrate and etching those three metal layers selectively. It is preferable that the metal wire layer 6 is made of aluminum alloy. Also, it is preferable that the aluminum alloy layer is deposited at a temperature equal to or higher than 100° C. to make the grains larger, which enables low resistance value.

The passivation metal layer 8 is made of a metallic material including Ti, TiN, Ta, TaN, WN, or Si and having higher melting point than that of aluminum alloy, and it is formed on the surface of the metal wire layer 6 to have 300–1,000 Å thickness, preferably 600 Å. The passivation metal layer 8 is deposited at a temperature of 100–300° C., preferably 200° C.

Figure 3B:
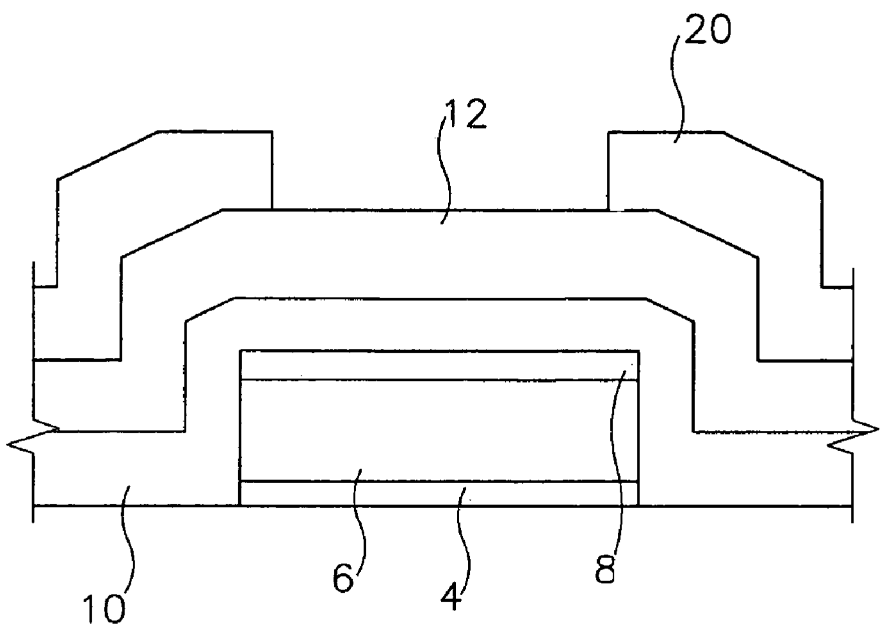

Next, an insulating layer 10 and a passivation layer 12 are formed respectively by depositing an oxide layer and a nitride layer on the passivation metal layer 8, the metal wire layer 6, and the barrier metal layer 4, which are deposited in sequence. Subsequently, as shown in FIG. 3b, a photoresist layer 20 is coated on the passivation layer 12, and the photoresist layer 20 is exposed and developed to selectively remove a portion of the photoresist layer, on which a contact hole 2a will be formed.

Figure 3C:
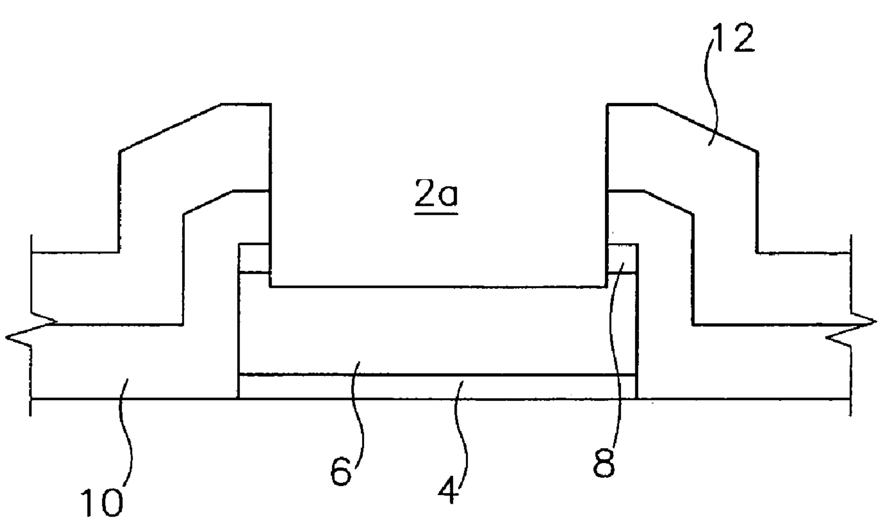

Succeedingly, the exposed portion of the passivation layer 12 by the removed photoresist layer is etched, the insulating layer 10 and the passivation metal layer 8 under the passivation layer 12 are contiguously etched to expose the metal wire layer 6, and the photoresist layer 20 is removed. Then, as shown in FIG. 3c, the contact hole 2a having a prescribed width is completed, and a portion of the upper surface of the metal wire layer 6 is exposed by means of the contact hole 2a.

Figure 3D:
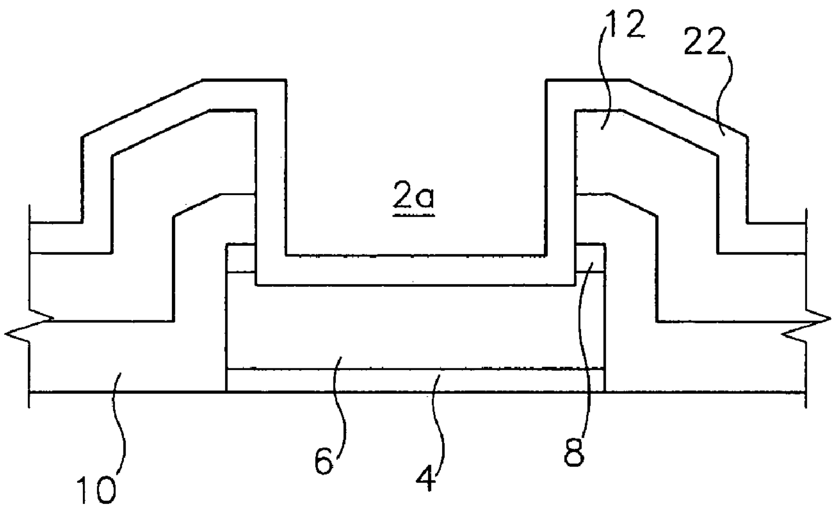

Next, as shown in FIG. 3d, a metal layer 22 is deposited on the whole surfaces of the passivation layer 12 and the contact hole 2a. The metal layer 22 is made of a metallic material such as Al, Ti, or TiN. It is preferable that the thickness of the metal layer 22 is 1,000–5,000 Å and the deposition temperature thereof is 200–400° C.

Subsequently, a portion of the metal layer 22 on the surfaces of the passivation layer 12 and the metal wire layer 6 is removed by dry-etching the metal layer 22. When the dry-etching process is completed, the metal layer 22 is remained only on the inner surface of the contact hole 2a to serve as the adhesive metal layer 14 as shown in FIG. 2a.

According to the present invention, the bonding pad 2 is provided with the adhesive metal layer 14 inside the contact hole 2a, and the adhesive metal layer 14 enables soldering and metal wire to be fixed firmly to the contact hole 2a during bonding process, which will be described afterward, and prevents moisture from penetrating into the insulating layer 10 during molding process.

That is, during bonding process, a metal wire 18 is placed on the metal wire layer 6, and the metal wire 18 is fixed to the contact hole 2a using a soldering material 16 as shown in FIG. 2b. Since the adhesive metal layer 14 is formed inside the contact hole 2a, contact area between the soldering material and the contact hole 2a is enlarged, which makes the soldering and the metal wire 18 be fixed more firmly to the contact hole 2a.

Figure 3E:
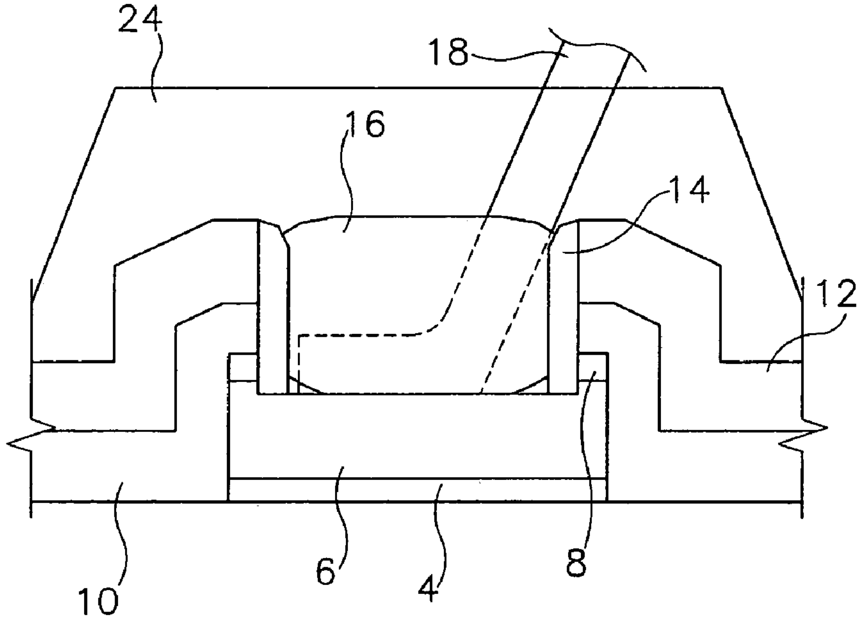

Succeedingly, as shown in FIG. 3e, the contact hole 2a and the soldering are molded using a molding material 24 such as epoxy during molding process. Then, the adhesive metal layer 14 prevents moisture from penetrating into the insulating layer 10.

Although preferred embodiments of the present invention have been described in detail hereinabove, it should be clearly understood that many variations and/or modifications of the basic inventive concepts herein taught which may appear to those skilled in the present art will still fall within the spirit and scope of the present invention, as defined in the appended claims.

By forming the adhesive metal layer inside the contact hole of the bonding pad, contact area between the soldering material and the contact hole is enlarged to make the metal wire and the soldering be fixed to the contact hole firmly.

Also, it has another advantage to prevent moisture from penetrating into the insulating layer during molding process using epoxy.

What is claimed is:

1. A bonding pad of a semiconductor device comprising:

a barrier metal layer on a semiconductor substrate;

a metal wire layer on the baffler metal layer;

a passivation metal layer on the metal wire layer, having a removed portion exposing an upper surface portion of the metal wire layer;

an insulating layer on the passivation metal layer, having a contact hole exposing the metal wire layer via the removed portion of the passivation metal layer; and an adhesive metal layer on an inner surface of the contact hole, exposing the metal wire layer.

2. The bonding pad of claim 1, wherein the adhesive metal layer comprises a metallic material selected from the group of Al, Ti, and TiN.

3. The bonding pad of claim 1, wherein the adhesive metal layer has a thickness of 1000–3000 Å.

4. A formation method of a bonding pad of a semiconductor device comprising:

forming a barrier metal layer on a semiconductor substrate and depositing a metal wire layer and a passivation metal layer on the barrier metal layer;

forming an insulating layer and a passivation layer covering the baffler metal layer, the metal wire layer, and the passivation metal layer;

forming a contact hole by coating a photoresist layer on the passivation layer, exposing and developing the photoresist layer to remove a portion of the photoresist layer selectively on an area where the contact hole will be formed, and etching the passivation layer exposed by the removed portion of the photoresist layer and the insulating layer and the passivation metal layer under the passivation layer;

removing the photoresist layer and forming a metal layer on entire surfaces of the passivation layer and the contact hole; and forming an adhesive metal layer by dry-etching the metal layer to remove a portions of the metal layer on the upper surfaces of the passivation layer and metal wire layer and leave a portion of the metal layer on an inside surface of the contact hole, exposing the metal wire layer.

5. The method of claim 4, wherein the metal wire layer is farmed by depositing aluminum alloy at a temperature of equal to or higher than 100° C.

6. The method of claim 4, wherein the metal layer comprises at least one metallic material selected from the group of Al, Ti, and TiN.

7. The method of claim 4, wherein the metal layer has a thickness of 1000–3000 Å.

8. The method of claim 4, wherein the metal layer is deposited at a temperature of 200–400° C.

9. The bonding pad of claim 1, wherein the adhesive metal layer extends to the upper surface of the metal wire layer.

10. The bonding pad of claim 1, wherein the metal wire layer comprises an aluminum alloy.

11. The bonding pad of claim 1, wherein the passivation metal layer comprises a metallic material selected from the group consisting of Ti, TiN, Ta, TaN, WN and Si.

12. The bonding pad of claim 1, wherein the insulating layer comprises an oxide.

13. The bonding pad of claim 1, further comprising a passivation layer on the insulating layer.

14. The bonding pad of claim 13, wherein the passivation layer comprises a nitride.

15. A semiconductor device, comprising the bonding pad of claim 1, a soldering material in the contact hole, and a metal wire fixed thereto.

16. The bonding pad of claim 1, wherein the barrier metal layer comprises a metal selected from the group consisting of Ti, Ta, TiN and TaN.

17. The bonding pad of claim 1, wherein the barrier metal layer has a thickness of 200–1000 Å.

18. The bonding pad of claim 1, wherein the metal layer remains only on the inner surface of the contact hole.

19. The method of claim 4, wherein the metal layer remains only on the inner surface of the contact hole.

* * * * *